United States Patent
Hu et al.

(10) Patent No.: US 6,466,030 B2
(45) Date of Patent: Oct. 15, 2002

(54) SYSTEMS AND METHODS FOR LOCATING FAULTS ON A TRANSMISSION LINE WITH A SINGLE TAPPED LOAD

(75) Inventors: Yi Hu, Cary; David Lubkeman, Raleigh, both of NC (US); Reto Buettner, Erlenbach (CH); David Hart, Raleigh, NC (US)

(73) Assignee: ABB Power Automation Ltd., Baden (CH)

( * ) Notice: Subject to any disclaimer, the term of this patent is extended or adjusted under 35 U.S.C. 154(b) by 0 days.

(21) Appl. No.: 09/752,382

(22) Filed: Dec. 29, 2000

(65) Prior Publication Data

US 2002/0121903 A1 Sep. 5, 2002

(51) Int. Cl.$^7$ .............................................. G01R 31/08
(52) U.S. Cl. ......................................... 324/522; 361/79
(58) Field of Search ........................... 702/59; 324/522, 324/525; 361/79

(56) References Cited

U.S. PATENT DOCUMENTS

| | | | |
|---|---|---|---|
| 4,107,778 A | 8/1978 | Nii et al. ..................... 364/492 |
| 4,313,169 A | 1/1982 | Takagi et al. ................ 364/492 |
| 4,371,907 A | 2/1983 | Bignell ........................ 361/82 |
| 4,559,491 A | 12/1985 | Saha ............................ 324/52 |
| 4,560,922 A | 12/1985 | Heller et al. .................. 324/52 |
| 4,841,405 A | 6/1989 | Udren ........................... 361/80 |
| 4,857,854 A | 8/1989 | Matsushima ................. 324/512 |
| 4,906,937 A | 3/1990 | Wikström et al. ........... 324/522 |
| 4,996,624 A | 2/1991 | Schweitzer, III ............. 361/63 |
| 5,072,403 A | 12/1991 | Johns ........................... 364/492 |
| 5,428,549 A | 6/1995 | Chen ............................ 364/483 |
| 5,455,776 A | 10/1995 | Novosel ....................... 364/492 |
| 5,485,394 A * | 1/1996 | Murata ......................... 702/59 |
| 5,572,138 A | 11/1996 | Nimmersjö ................. 324/522 |
| 5,661,664 A | 8/1997 | Novosel et al. ............. 634/492 |
| 5,783,946 A | 7/1998 | Yang ............................ 324/522 |
| 5,825,189 A | 10/1998 | Johns ........................... 324/525 |
| 5,839,093 A * | 11/1998 | Novosel ....................... 702/59 |
| 6,148,267 A | 11/2000 | Premerlani ................... 702/58 |

FOREIGN PATENT DOCUMENTS

| | | |
|---|---|---|
| EP | 0 334 310 A1 | 9/1989 |
| EP | 0 464 662 A1 | 1/1992 |
| WO | WO 95/24014 | 9/1995 |

OTHER PUBLICATIONS

Meliopoulos et al., "Use of DFR Data for Fault Locating", *Proc. Of Fault and Distrubance Analysis Conference,* May 2000, Atlanta, GA, USA.

(List continued on next page.)

*Primary Examiner*—Christine K. Oda
(74) *Attorney, Agent, or Firm*—Woodcock Washburn LLP

(57) ABSTRACT

A fault is located in a transmission line with a sending end, a receiving end, and a tapped load connected to the transmission line at a tap node. The tap node divides the transmission line into a sending side and a receiving side. The sending end and the receiving end each include a measuring device. The fault location is determined by obtaining measured circuit parameters including measured pre-fault and faulted current and voltage values at the sending end and at the receiving end of the transmission line. The phase angle difference due to unsynchronized measurement using the measured pre-fault current and the measured pre-fault voltage values may be calculated. The load impedance of the tapped load is calculated. A first fault location is calculated assuming that the fault is located on the sending side of the tap node. A second fault location is calculated assuming that the fault is located on the receiving side of the tap node. The fault location is selected from one of the first fault location and the second fault location, by selecting the fault location having a value within a predetermined range representing a full distance between two nodes.

41 Claims, 4 Drawing Sheets

OTHER PUBLICATIONS

Novosel et al., "Unsynchronized Two–Terminal Fault Location Estimation", *IEEE Transactions on Power Delivery*, Jan. 1996, vol. 11. No. 1, pp. 130–138.

Nagasawa et al., "Development of a New Fault Location Algorithm for Multi–Terminal Two Parallel Transmission Lines", *IEEE Transactions on Power Delivery*, Jul. 1992, vol. 7, No. 3, pp. 1516–1529.

Abe et al., "Development of a New Fault Location System For Multi–Terminal Single Transmission Lines", *IEEE Transactions on Power Delivery*, Jan. 1995, vol. 10, No. 1, pp. 159–168.

Srinivasan et al., "A New Fault Location Algorithm for Radial Transmission Lines with Loads", *IEEE Transactions on Power Delivery*, Jul. 1989, vol. 4, No. 3, pp. 1676–1682.

Sachdev et al., "A Technique for Estimating Transmission Line Fault Locations from Digital Impedance Relay Measurements", *IEEE Transactions on Power Delivery*, Jan. 1988, vol. 3, No. 1, pp. 121–129.

Aggarwal et al., "New Concept in Fault Location for Overhead Distribution Systems Using Superimposed Components", *IEE Proc.–Gener. Transm. Distrib.*, May 1997, vol. 144, No. 3, pp. 309–316.

Girgis et al., "Fault Location Techniques for Radial an Loop Transmission Systems Using Digital Fault Recorded Data", *IEEE Transactions on Power Delivery*, Oct. 1992, vol. 7, No. 4, pp. 1936–1945.

Johns et al., "Accurate Fault Location Technique for Power Transmission Lines", *IEE Proceedings*, Nov. 1990, vol. 137, Pt. C, No. 6, pp. 395–402.

Girgis et al., "A New Fault Location Technique for Two- and Three–Terminal Lines", *IEEE Transactions on Power Delivery*, Jan. 1992, vol. 7, No. 1, pp. 98–107.

Eriksson et al. "An Accurate Fault Locator with Compensation for Apparent Reactance in the Fault Resistance Resulting from Remote–End Infeed", *IEEE Transactions on Power Apparatus and Systems,* Feb. 1985, vol. PAS–104, No. 2, pp. 424–436.

Takagi et al., "Development of a New Type Fault Locator Using the One–Terminal Voltage and Current Data", *IEEE Transactions on Power Apparatus and Systems,* Aug. 1982, vol. PAS–101, No. 8, pp. 2892–2898.

Djurić et al., "Time Domain Solution of Fault Estimation and Arcing Faults Detection on Overhead Lines", *IEEE Transactions on Power Delivery,* Jan. 1999, vol. 14, No. 1, pp. 60–67.

Djurić et al., "A New Approach to the Arcing Faults Detection for Fast Autoreclosure in Transmission Systems", *IEEE Transaction on Power Delivery,* Oct. 1995, vol. 10, No. 4, pp. 1793–1798.

Reineri et al, "Load Research for Fault Location in Distribution Feeders", *IEE Proc.– Gener. Transm. Distrib.,* Mar. 1999, vol. 146, No. 2, pp. 115–120.

* cited by examiner

SYSTEMS AND METHODS FOR LOCATING FAULTS ON A TRANSMISSION LINE WITH A SINGLE TAPPED LOAD

CROSS-REFERENCE TO RELATED APPLICATIONS

This application is related to co-pending and commonly assigned U.S. patent application Ser. No. 09/752,892 filed Dec. 29, 2000, entitled "Systems and Methods for Locating Faults on a Transmission Line with Multiple Tapped Loads."

FIELD OF THE INVENTION

The present invention relates to systems and methods for locating faults in a power transmission system, more particularly, a power transmission system with a single tapped load.

BACKGROUND OF THE INVENTION

Power transmission lines carry current from generating sources to electric power users. The power transmission lines are typically high voltage lines and are typically transformed down to a lower voltage at a power substation, before being distributed to individual electric power users (e.g., homes and business buildings). At many power substations, protective relays are included and perform the following functions in connection with the transmission system: (A) substation control and data acquisition and (B) protection. Data acquisition typically contains the functionality of (a) monitoring the system to ascertain whether it is in a normal or abnormal state; (b) metering, which involves measuring certain electrical quantities for operational control; and (c) alarming, which provides a warning of some impending problem. Protection typically involves fast tripping a circuit breaker in response to the detection of a short-circuit condition (a fault), typically within a few electrical cycles after a fault occurs.

The detection of a fault in a protection function involves measuring critical system parameters and, when a fault occurs, quickly making a rough estimate of the fault location and of certain characteristics of the fault so that the faulted line can be isolated from the power grid as quick as possible. A fault occurs when a transmission line, typically due to external causes, diverts electrical current flow from its normal path along the transmission line.

The major types and causes of faults are insulation faults, caused by design defects, manufacturing defects, improper installation, and aging insulation; electrical faults, caused by lightning surges, switching surges, and dynamic overvoltages; mechanical faults, caused by wind, snow, ice, contamination, trees, and animals; and thermal faults, caused by overcurrent and overvoltage conditions.

A transmission line typically includes three phase lines, however, a transmission line may also contain one phase, or some other number of phases. With a three-phase transmission line, there are several types of possible faults. A single-phase fault is a fault from a single phase to ground (e.g. phase a to ground). A phase-to-phase fault is a fault from one phase to another phase (e.g., phase a to phase b). A phase-to-phase-to-ground fault is a fault that involves two phases and the ground (e.g., phase a and phase b to ground). A three-phase fault is a fault that involves all three phases and which may or may not involve the ground (e.g., phase a, phase b, and phase c to ground).

In addition to protection functions, digital fault recorders or other processors may be included at a power substation or at a remote site for calculating fault locations. Fault location does not have to be as fast as protection function, which may be calculated after the fault has been handled by the protection function, but it should estimate the actual fault location more accurately than a protection function. Accurate fault location facilitates fast location and isolation of a damaged transmission line section, and quick restoration of service to utility customers after repair of the faulted line.

In addition to supplying power to an electrical user through a power substation with protective relaying, electrical utilities may also provide power to electrical users through a tap, referred to as a tap node. The tap is a connection point to a phase or phases of the power transmission system. The tap is connected to a tap lateral, which in turn is connected to and supplies power to a load, referred to as a tapped load. There may be more than one tapped load on a tap lateral. A tapped load typically does not have protective relaying, and therefore, does not usually have current and voltage data being measured/recorded.

Many fault location calculation systems exist for determining the location of a fault on a power transmission line. In these systems, voltage and current are measured at one or both ends of a segment of the transmission line. In some systems, the voltage and current measurements at both ends of a segment are synchronized. In a synchronized system, the voltage and current readings must have their time clocks synchronized. In some systems, data acquired before the fault condition is used in the calculation. Some prior fault location calculations are inaccurate for transmission lines with a tapped load, because they were designed for use on transmission lines without tapped loads. Some fault location calculations are only applicable to certain types of faults, thus a fault type must be selected before or during the calculation process, and the performance of these systems may be affected by the fault type selection.

The prior art does not address calculating fault locations on a power transmission line with a single tapped load, using synchronized or unsynchronized data from two ends (e.g., two protective relays providing current and voltage readings). In a power transmission line with a tapped load, the calculations used previously yield less accurate estimations of the fault location. The fault location calculation on transmission lines with a single tapped load must resolve the main problems of a lack of measurement at the tap node, the fact that measurements at both ends of a tapped line may or may not be synchronized, and the fact that a tapped load is normally not a fixed load, but a varying load.

Therefore, a need exists for a system and method for calculating a fault location in a transmission line with a single tapped load using synchronized or unsynchronized measured data from two ends. The present invention satisfies this need.

SUMMARY OF THE PRESENT INVENTION

The present invention is directed to systems and methods for calculating a fault location in a transmission line with a tapped load using synchronized or unsynchronized measured data from two ends.

According to an aspect of the invention, a fault is located in a transmission line with a sending end, a receiving end, and a tapped load connected to the transmission line at a tap node. The tap node divides the transmission line into a sending side and a receiving side. The sending end and the receiving end each include a measuring device. The fault location is determined by obtaining measured circuit parameters including measured pre-fault and faulted current and voltage values at the sending end and at the receiving end of the transmission line. The phase angle difference due to unsynchronized measurement may be calculated using the measured pre-fault current and the measured pre-fault voltage values. The load impedance of the tapped load is calculated. A first fault location is calculated assuming that the fault is located on the sending side of the tap node. A second fault location is calculated assuming that the fault is located on the receiving side of the tap node. The fault location is selected from one of the first fault location and the second fault location, by selecting the fault location having a value within a predetermined range representing a full distance between two nodes.

According to another aspect of the invention, a fault location may be calculated for many types of faults.

According to a further aspect of the invention, a fault location may be calculated for both single phase and three phase transmission lines.

According to another aspect of the invention, the measured data may be synchronized or unsynchronized.

These and other features of the present invention will be more fully set forth hereinafter.

BRIEF DESCRIPTION OF THE DRAWINGS

The present invention is further described in the detailed description that follows, by reference to the noted plurality of drawings by way of non-limiting examples of exemplary embodiments of the present invention, in which like reference numerals represent similar elements throughout the several views of the drawings, and wherein.

DETAILED DESCRIPTION OF THE PREFERRED EMBODIMENTS

The present invention is directed to systems and methods for calculating a fault location in a transmission line with a single tapped load using synchronized or unsynchronized measured data from two ends.

Figure 1:
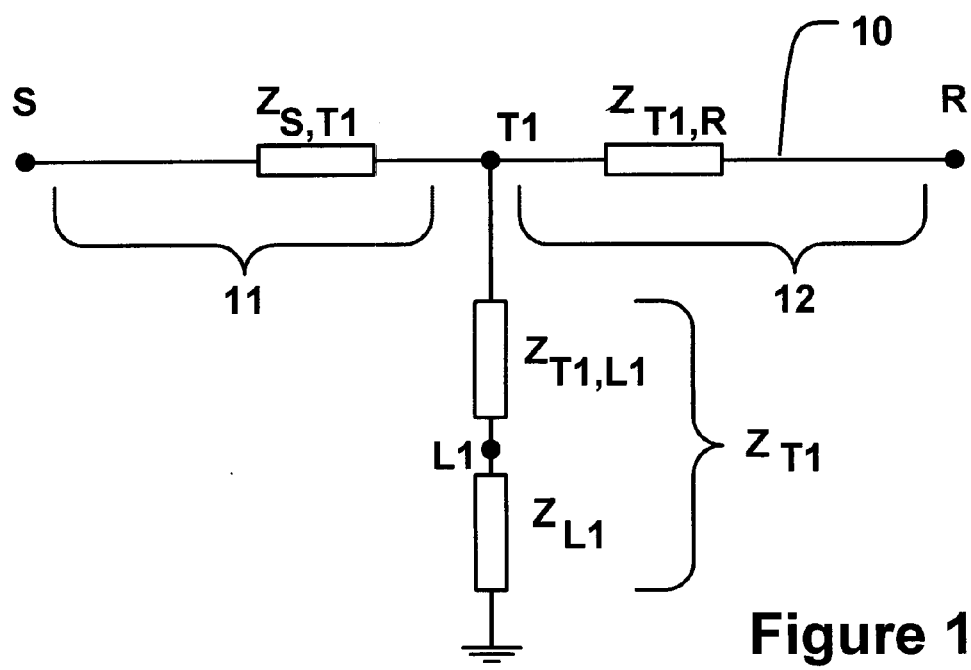
FIG. 1 is a block diagram of an exemplary transmission line with a single tapped load.

FIG. 1 illustrates an exemplary transmission line with a single tapped load. As shown in FIG. 1, the transmission line 10 includes a sending end S, a receiving end R, and a tap T1, also referred to herein as tap node T1, between the sending end S and the receiving end R. A load node L1 is connected to the tap node T1 through a tap lateral. A load is connected to load node L1. The tap node T1 divides the transmission line into a sending side 11 and a receiving side 12.

In order to describe the invention, the following naming conventions will be used. Upper case letters, which are not subscripted or superscripted, designate a physical value according to Table 1. The values may be measured values, known values, or calculated values.

TABLE 1

| V | Voltage, a complex value |
|---|---|
| I | Current, complex value |
| Z | Impedance, complex value |
| R | Resistance, real value, the real part of impedance Z |
| X | Reactance, real value, the imaginary part of impedance Z |

A lower case letter following a physical value designates whether the value is a pre-fault value or a faulted value according to Table 2. The distance to the fault within a transmission line segment is designated by m.

TABLE 2

| p | pre-fault |
|---|---|
| none | faulted (during the fault) |
| m | unit distance to fault within segment, real value |

Typically there are three phases of a fault distinguished in fault analysis: pre-fault, faulted and post-fault. Pre-fault is before the instant of the fault, faulted is from the instant of the fault to the actuation of circuit protection, and post-fault is after the actuation of circuit protection.

A superscript designates the phase or the symmetrical sequence components according to Table 3.

TABLE 3

| a | Phase a |
|---|---|
| b | Phase b |
| c | Phase c |
| 0 | Zero sequence |
| 1 | Positive sequence |
| 2 | Negative sequence |

A subscript designates the node according to Table 4. When two subscripts are separated by a comma, the subscripts designate the "from" node and the "to" node, respectively. For example the subscript S, T1 designates from the sending end S to the tap node T1. When only one node is designated, it is designated as the "from" node and the "to" node is ground. For example, the subscript T1 designates from tap node T1 to ground. Alternately, the "to" node may be designated as 0 for ground.

TABLE 4

| S | Sending end of transmission line |
|---|---|
| R | Receiving end of transmission line |
| Tx | Tap node x |
| Lx | Load node x |
| F | Fault point, faulted node, or fault location |

The following examples illustrate the naming convention. $V_{T1}{}^a$ or $V_{T1,0}{}^a$ represents a complex faulted value of voltage during a fault, of phase a, from tap node T1 to ground. $Ip^0{}_{T4,R}$ represents a zero sequence complex pre-fault value of current from tap node T4 to the receiving end R.

As shown in FIG. 1, the impedance from the sending end S to the tap node T1 is $Z_{S,T1}$. The impedance from the tap node T1 to the receiving end R is $Z_{T1,R}$. The impedance from the tap node T1 to the load node L1 is $Z_{T1,L1}$. The impedance of the load is $Z_{L1}$. The impedance from the tap node T1 to ground is $Z_{T1}$, which includes the impedance from $Z_{T1,L1}$ and $Z_{L1}$.

Figure 2:
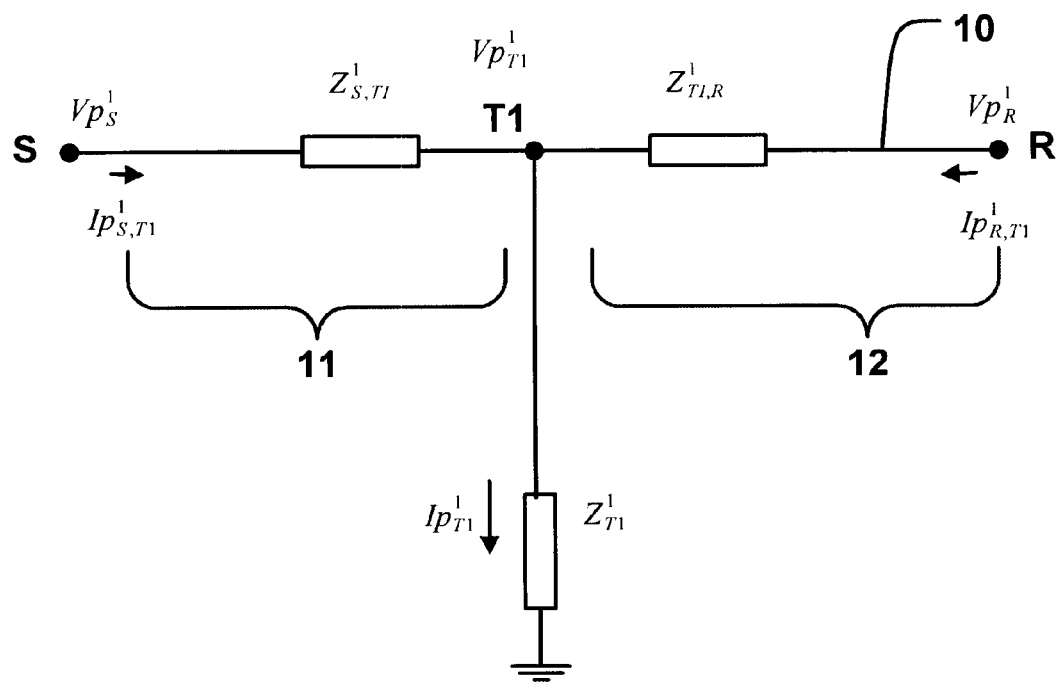
FIG. 2 is a block diagram of the exemplary transmission line of FIG. 1 illustrating exemplary pre-fault conditions.

FIG. 2 illustrates exemplary pre-fault conditions on the transmission line of FIG. 1. As shown in FIG. 2, $Vp_S{}^1$ is a positive sequence pre-fault complex voltage from the sending end S to ground. $Ip_S^{1,T1}$ is a positive sequence pre-fault complex current from the sending end S to the tap node T1. $Z^1_{S,T1}$ is a positive sequence complex impedance from the sending end S to the tap node T1. $VP_{T1}^1$ is a positive sequence pre-fault complex voltage from the tap node T1 to ground. $Ip^1_{T1}$ is a positive sequence pre-fault complex current from the tap node T1 to ground. $Z^1_{T1}$ is a positive sequence complex impedance from the tap node T1 to ground (including the load impedance $Z_{L1}$) $Vp^1_R$ is a positive sequence pre-fault complex voltage from the receiving end R to ground. $Ip^1_{R,T1}$ is a positive sequence pre-fault complex current from the receiving end R to the tap node T1. $Z^1_{T1,R}$ is a positive sequence complex impedance from the tap node T1 to the receiving end R.

The values $Vp^1_S$, $Ip^1_{S,T1}$, $VP^1_R$, and $Ip^1_{R,T1}$ are measured values. The values $Z^1_{S,T1}$ and $Z^1_{T1,R}$ are known values, which may be calculated from the distance of the transmission line segment and the characteristics of the transmission line using well known conventional methods.

Figure 3A:
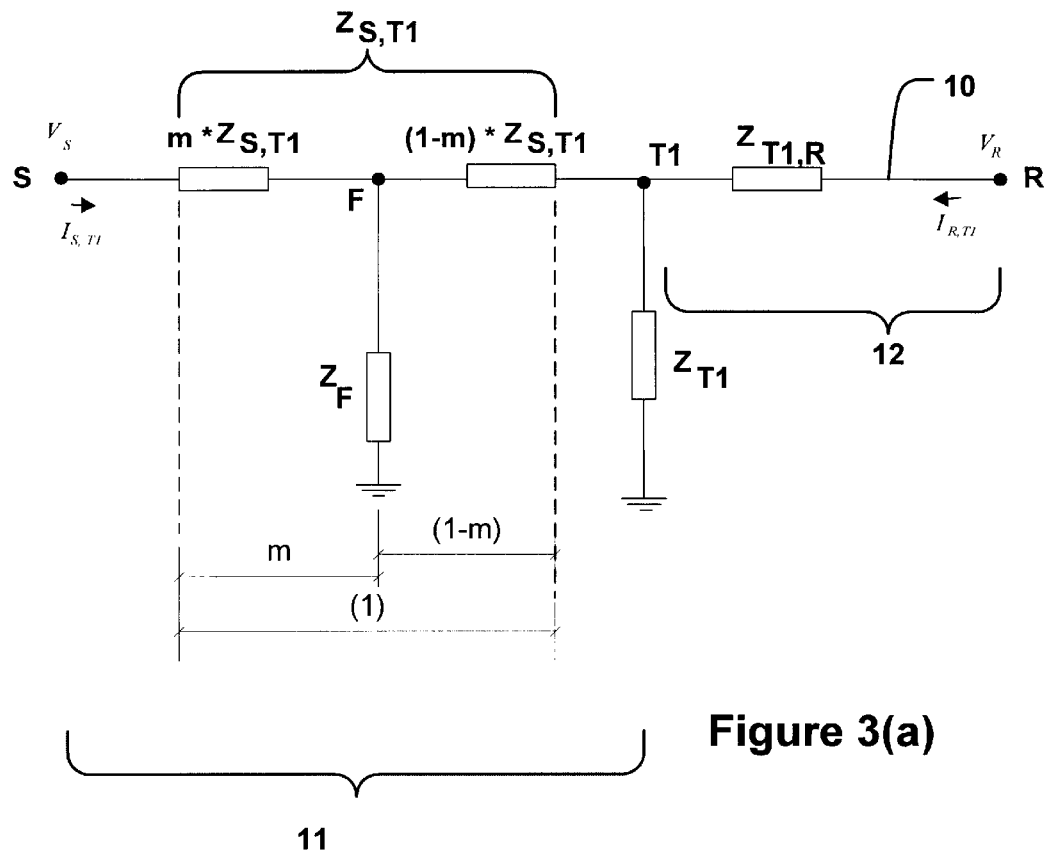
FIG. 3a is a block diagram of the exemplary transmission line of FIG. 1 illustrating exemplary faulted conditions.

FIG. 3a illustrates exemplary faulted conditions on the transmission line of FIG. 1 with an exemplary fault to ground. As shown in FIG. 3a, a fault node F is located on the transmission line 10. The fault node F is located between sending end S and tap node T1. As such, the fault provides a path to ground with impedance $Z_F$.

As shown in FIG. 3a, the tap node T1 divides the transmission line into the sending side 11 and the receiving side 12. The sending side 11 has an impedance of $Z_{S,T1}$. The receiving side 12 has an impedance of $Z_{T1,R}$.

The fault node F divides the impedance from sending end S to tap node T1 into two impedances. The first impedance is $(m*Z_{S,T1})$ and the second impedance is $((1-m)*Z_{S,T1})$ In one embodiment, for a distance of one from the sending end S to the tap node T1, the fault node F lies a distance of m away from the sending end S, and a distance of (1-m) from the tap node T1. For example, if m is 0.4 and the distance between sending end S and tap node T1 is ten miles, then the distance from the sending end S to the fault node F is four miles and the distance from the fault node F to the tap node T1 is six miles. More generally, the fault node F lies a fraction of m between node h and node i, represented by $m_{h,i}$.

Figure 3B:
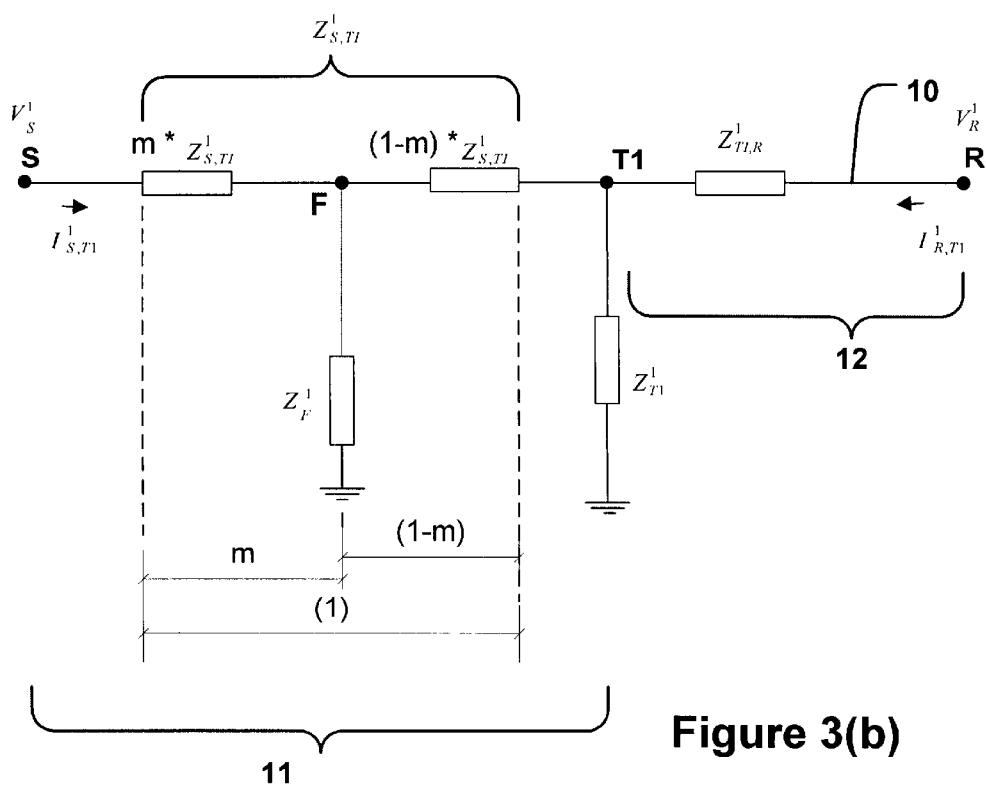
FIG. 3b is a block diagram of the exemplary transmission line of FIG. 1 illustrating exemplary fatigued conditions with positive sequence values.

As shown in FIG. 3b, $V^1_S$ is a positive sequence faulted complex voltage from the sending end S to ground. $V^1_R$ is a positive sequence faulted complex voltage from the receiving end R to ground. $I^1_{S,T1}$ is a positive sequence faulted complex current from the sending end S to the tap node T1. $I^1_{R,T1}$ is a positive sequence faulted complex current from the receiving end R to the tap node T1. $Z^1_{T1}$ is a positive sequence complex impedance from the tap node T1 to ground (including the tap load impedance $Z_{L1}$). The values $V^1_S$, $I^1_{S,T1}$, $V^1_R$, and $I^1_{R,T1}$ are measured values. $Z^1_F$ is an equivalent positive sequence fault impedance from the fault node F to ground in the positive sequence network of the line.

The following assumptions are made: the tapped load is a positive sequence impedance which does not change during the fault; and there is only one single fault on the transmission line.

The present invention may use pre-fault measurements to determine the time difference (or phasor angle difference) of the voltage and current signals from both ends of a power transmission line to synchronize the measured signals. If the data is already synchronized, the phase angle is zero. Using the pre-fault data, the system also determines the equivalent load impedance of the tapped load. The synchronized faulted data and the calculated tapped load impedance are used to perform the initial fault location estimation. One calculation is performed assuming that the fault is on the sending side 11 of the tap node T1. A second calculation is performed assuming that the fault is on the receiving side 12 of the tap node T1. The correct fault location is selected from the two calculations. Positive sequence network quantities are used to solve for fault distance.

Figure 4:
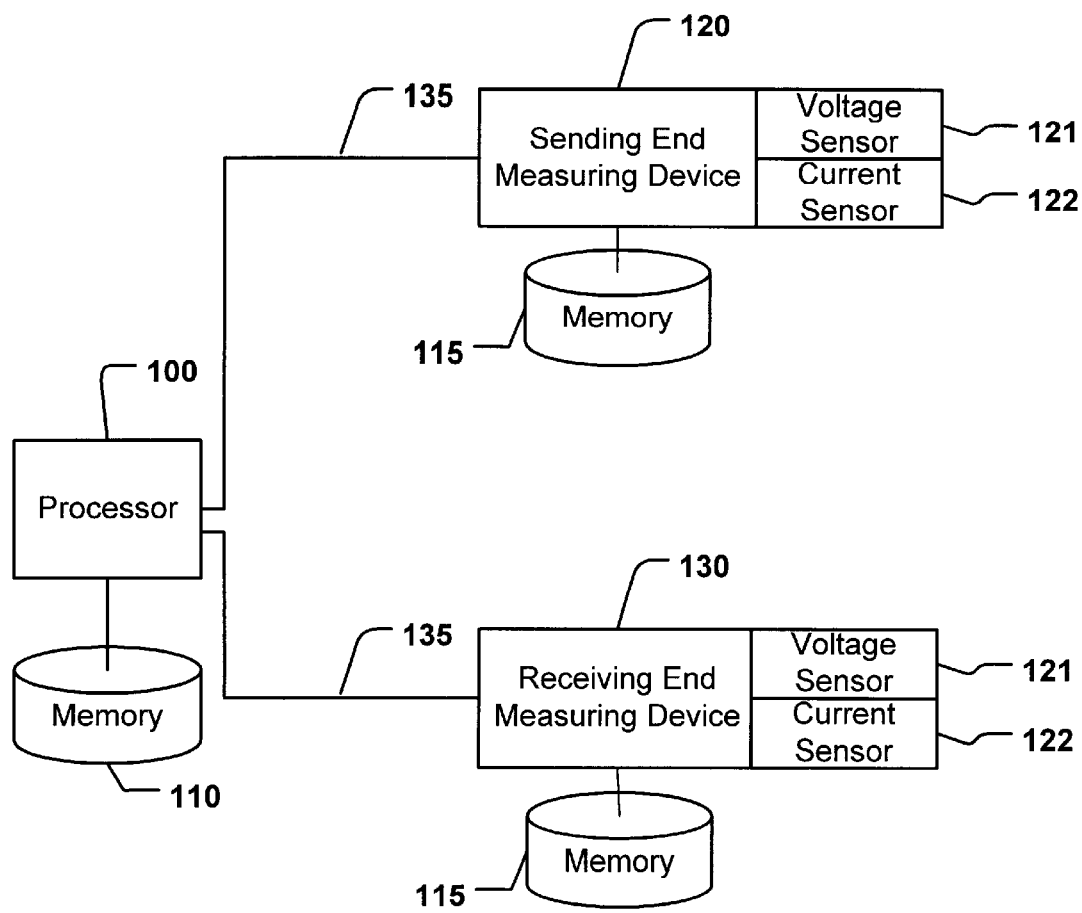
FIG. 4 is a block diagram of an embodiment of the present invention.

FIG. 4 is a block diagram of an exemplary embodiment of a system in accordance with the present invention. As shown in FIG. 4, the system includes a processor 100, a memory 110, a sending end measuring device 120, and a receiving end measuring device 130.

The processor 100 may be any processor suitable for performing calculations and receiving input data from measuring devices. For example, the processor 100 may be a protective relay with oscillographic data capture or a digital fault recorder. The memory 110 may be used to store data received from the sending end measuring device 120 and the receiving end measuring device 130.

The sending end measuring device 120 measures voltage and current, including both pre-fault and faulted measurements, at the sending end S of the transmission line 10. The sending end measuring device 120 may comprise a memory 115 to store pre-fault measurements. The sending end measuring device 120 may comprise a voltage sensor 121 and a current sensor 122. The voltage sensor 121 and current sensor 122 may output an analog signal. The sending end measuring device 120 may convert the analog signal to a digital signal using known analog to digital techniques before transmission over data link 135. The sending end measuring device 120 may further convert the digital signal into vectors representing current and voltage, $VP^1_S$, $Ip^1_{S,T1}$, $V^1_S$, and $I^1_{S,T1}$ at the sending end S.

The receiving end measuring device 130 measures voltage and current, including both pre-fault and faulted measurements, at the receiving end R of the transmission line 10. The receiving end measuring device 130 may comprise a memory 115 to store pre-fault measurements. The receiving end measuring device 130 may comprise a voltage sensor 121 and a current sensor 122. The voltage sensor and current sensor may output an analog signal. The receiving end measuring device 130 may convert the analog signal to a digital signal using known analog to digital techniques before transmission over data link 135. The receiving end measuring device 130 may further convert the digital signal into vectors representing current and voltage, $Vp^1_R$, $Ip^1_{R,T1}$, $V^1_R$ and $I^1_{R,T1}$ at the receiving end R.

The measuring devices 120, 130 are connected to the processor 100 via a data link 135. The data link 135 may be a modem, a local area network, or any suitable data link.

Figure 5:
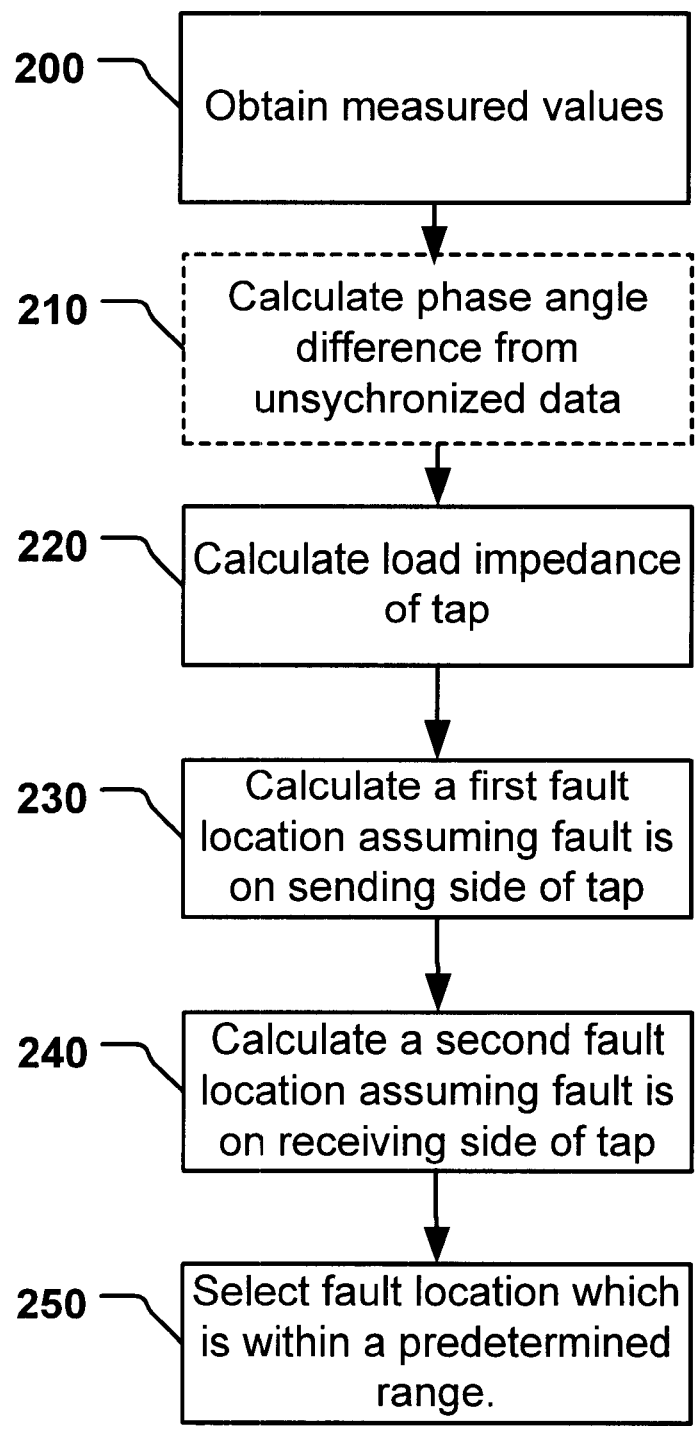
FIG. 5 is a flow chart showing details of an embodiment of the present invention.

FIG. 5 is a flow chart showing further details of the operation of the system of FIG. 4 and of an embodiment of a method in accordance with the present invention. As shown in FIG. 5, at step 200, the measured values are obtained. The pre-fault measured values are $Vp^1_S$, $Ip^1_{S,T1}$, $VP^1_R$, and $Ip^1_{R,T1}$ The faulted measured values are $V^1_S$, $I^1_{S,T1}$, $V^1_R$ and $I^1_{R,T1}$.

At step 210, the phase angle difference, δ, is calculated as a vector $e^{i\delta}$ if the data is unsynchronized, using pre-fault data according to the following equation. If the data is synchronized the phase angle difference is zero.

$$e^{j\delta} = \frac{Vp_S^1 - Z_{S,T1}^1 Ip_{S,T1}^1}{Vp_R^1 - Z_{R,T1}^1 Ip_{R,T1}^1} \quad \text{Equation 1}$$

At step 220, the load impedance of tap node T1 is calculated using pre-fault data and the phase angle difference according to the following equation.

$$Z_{T1}^1 = \frac{Vp_{T1}^1}{Ip_{S,T1}^1 + e^{j\delta} Ip_{R,T1}^1} = \frac{Vp_S^1 - Z_{S,T1}^1 Ip_{S,T1}^1}{Ip_{S,T1}^1 + e^{j\delta} Ip_{R,T1}^1} \quad \text{Equation 2}$$

At step 230, a first fault location, $m_{S,T1}$ is calculated assuming that the fault node F is located on the sending side 11. The first fault location is calculated from Equation 3. A universal network is used for fault location calculations of all fault types in the three-phase transmission line. The fault impedance, and the zero/negative sequence network that exists for the type of a fault, is represented in the positive sequence network of the tapped line by an equivalent balanced three-phase fault impedance network connected at the fault location to form the universal network. In this manner, a fault location may be calculated for any type of fault.

$$m_{S,T1} = \frac{V_S^1 - e^{j\delta} V_R^1 + Z_{R,T1}^1 e^{j\delta} I_{R,T1}^1 + Z_{S,T1}^1 \left( e^{j\delta} I_{R,T1}^1 - \frac{e^{j\delta} V_R^1 - Z_{R,T1}^1 e^{j\delta} I_{R,T1}^1}{Z_{T1}^1} \right)}{Z_{S,T1}^1 I_{S,T1}^1 + Z_{S,T1}^1 \left( e^{j\delta} I_{R,T1}^1 - \frac{e^{j\delta} V_R^1 - Z_{R,T1}^1 e^{j\delta} I_{R,T1}^1}{Z_{T1}^1} \right)} \quad \text{Equation 3}$$

At step 240, a second fault location, $m_{R,T1}$ is calculated assuming that the fault node F is located on the receiving side 12. The second fault location is calculated from Equation 4.

$$m_{R,T1} = \frac{e^{j\delta} V_R^1 - V_S^1 + Z_{S,T1}^1 I_{S,T1}^1 + Z_{R,T1}^1 \left( I_{S,T1}^1 - \frac{V_S^1 - Z_{S,T1}^1 I_{S,T1}^1}{Z_{T1}^1} \right)}{Z_{R,T1}^1 e^{j\delta} I_{R,T1}^1 + Z_{R,T1}^1 \left( I_{S,T1}^1 - \frac{V_S^1 - Z_{S,T1}^1 I_{S,T1}^1}{Z_{T1}^1} \right)} \quad \text{Equation 4}$$

At step 250 the correct solution is selected. When a correct assumption is made, the resulting fault location estimation is always within some predetermined range, if not, the result will be outside of the predetermined range. This criterion is used to select the accurate fault location result from the two estimations. The predetermined range is a range selected to represent the full distance between two nodes. In the present embodiment, the predetermined range for sending side is from zero to 1.0, which represent the distance between the sending node S and the tap node T1 when assuming that the fault lies between the sending node S and the tap node T1. Similarly, the predetermined range for receiving side is also from zero to 1.0, which represent the distance between the receiving node R and the tap node T1 when assuming that the fault lies between the receiving node R and the tap node T1. A result outside of the predetermined range cannot be correct, as it lies at a point outside of the distance between the two nodes. For example, using a unitary predetermined value of m, where the range of 0.0 to 1.0 represents the distance between two nodes, if $m_{S,T1}$ is calculated to be 2.4 in step 230 and $m_{R,T1}$ is calculated to be 0.4 in step 240, then $M_{R,T1}$ is selected, m=0.4, and the fault node F is on the receiving side 12. Selecting 2.4 would be contrary to the assumption that the fault is located on the sending side 11.

In another embodiment, the transmission line is a single-phase transmission line, the equations are the same except that the references to the positive sequence component is replaced by the phase quantities, and the equivalent fault impedance is the actual fault impedance.

As can be appreciated, the above described system and method meet the aforementioned need for systems and methods for calculating a fault location in a transmission line with a single tapped load using synchronized or unsynchronized measured data from two ends.

Although not required, the present invention may be embodied in the form of program code (i.e., instructions) stored on a computer-readable medium, such as a magnetic, electrical, or optical storage medium, including without limitation a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer, the machine becomes an apparatus for practicing the invention. The present invention may also be embodied in the form of program code that is transmitted over some transmission medium, such as over electrical wiring or cabling, through fiber optics, over a network, including the Internet or an intranet, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

It is to be understood that the foregoing examples have been provided merely for the purpose of explanation and are in no way to be construed as limiting of the present invention. Where the invention has been described with reference to embodiments, it is understood that the words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

What is claimed is:

1. A method for locating a fault in a transmission line, the transmission line comprising a sending end and a receiving end, a tapped load connected to the transmission line at a tap node, the tap node dividing the transmission line into a sending side and a receiving side, the sending end comprising a measuring device, the receiving end comprising a measuring device, the method comprising:

obtaining measured circuit parameters including measured current and voltage values at the sending end and at the receiving end of the transmission line;

calculating a load impedance of the tapped load;

calculating a first fault location assuming that the fault is located on the sending side of the tap node;

calculating a second fault location assuming that the fault is located on the receiving side of the tap node; and selecting the calculated fault location from one of either the first fault location and the second fault location, by selecting the fault location having a value within a predetermined range.

2. The method of claim 1 further comprising calculating a phase angle due to a time difference in unsynchronized measurements between the sending end measuring device and the receiving end measuring device using the measured pre-fault current and the measured pre-fault voltage values.

3. The method of claim 1 wherein the measured circuit parameters are synchronized between the sending end measuring device and the receiving end measuring device and a phase angle between the sending end measuring device and the receiving end measuring device is zero.

4. The method of claim 2 wherein the obtaining measured circuit parameters further comprises obtaining measured circuit parameters from the sending end measuring device and the receiving end measuring device.

5. The method of claim 2 wherein the obtaining measured circuit parameters further comprises obtaining the values, $VP^1_S$, $Ip^1_{S,T1}$, $VP^1_R$, $Ip^1_{R,T1}$, $V^1_S$, $I^1_{S,T1}$, $V^1_R$, and $I^1_{R,T1}$ where:

$Vp^1_S$ is the positive sequence pre-fault complex voltage from the sending end to ground, $Ip^1_{S,T1}$ is the positive sequence pre-fault complex current from the sending end to the tap node, $VP^1_R$ is the positive sequence pre-fault complex voltage from the receiving end to ground, $Ip^1_{R,T1}$ is the positive sequence pre-fault complex current from the receiving end to the tap node, $V^1_S$ is the positive sequence faulted complex voltage from the sending end to ground, $I^1_{S,T1}$ is the positive sequence faulted complex current from the sending end to the tap node, $V^1_R$ is the positive sequence faulted complex voltage from the receiving end to ground, and $I^1_{R,T1}$ is the positive sequence faulted complex current from the receiving end to the tap node, and the transmission line is a three phase transmission line.

6. The method of claim 5 wherein the calculating the phase angle further comprises calculating the phase angle according to the following equation:

$$e^{j\delta} = \frac{Vp^1_S - Z^1_{S,T1} Ip^1_{S,T1}}{Vp^1_R - Z^1_{R,T1} Ip^1_{R,T1}}$$

where:

$Z^1_{S,T1}$ is the positive sequence complex impedance from the sending end to the tap node, $Z^1_{R,T1}$ is the positive sequence complex impedance from the reeceiving end to the tap node, and δ is the phase angle.

7. The method of claim 6 wherein the calculating the load impedance of the tapped load comprises calculating the load impedance of the tapped load according to the following equation:

$$Z^1_{T1} = \frac{Vp^1_S - Z^1_{S,T1} Ip^1_{S,T1}}{Ip^1_{S,T1} + e^{j\delta} Ip^1_{R,T1}}$$

where $Z^1_{T1}$ is the positive sequence complex impedance of the tap node.

8. The method of claim 7 wherein the calculating the first fault location comprises calculating the first fault location according to the following equation:

$$m_{S,T1} = \frac{V^1_S - e^{j\delta} V^1_R + Z^1_{R,T1} e^{j\delta} I^1_{R,T1} + Z^1_{S,T1}\left(e^{j\delta} I^1_{R,T1} - \frac{e^{j\delta} V^1_R - Z^1_{R,T1} e^{j\delta} I^1_{R,T1}}{Z^1_{T1}}\right)}{Z^1_{S,T1} I^1_{S,T1} + Z^1_{S,T1}\left(e^{j\delta} I^1_{R,T1} - \frac{e^{j\delta} V^1_R - Z^1_{R,T1} e^{j\delta} I^1_{R,T1}}{Z^1_{T1}}\right)}$$

where $m_{S,T1}$ is the calculated first fault location.

9. The method of claim 8 wherein the calculating the second fault location comprises calculating the second fault location according to the following equation:

$$m_{R,T1} = \frac{e^{j\delta} V^1_R - V^1_S + Z^1_{S,T1} I^1_{S,T1} + Z^1_{R,T1}\left(I^1_{S,T1} - \frac{V^1_S - Z^1_{S,T1} I^1_{S,T1}}{Z^1_{T1}}\right)}{Z^1_{R,T1} e^{j\delta} I^1_{R,T1} + Z^1_{R,T1}\left(I^1_{S,T1} - \frac{V^1_S - Z^1_{S,T1} I^1_{S,T1}}{Z^1_{T1}}\right)}$$

where $m_{R,T1}$ is the calculated second fault location.

10. The method of claim 9 wherein the selecting the calculated fault location comprises selecting the calculated fault location from one of either $m_{S,T1}$ and $m_{R,T1}$ by selecting the one having a value within the predetermined range and the predetermined range represents a full distance between two nodes.

11. The method of claim 10 wherein the predetermined range is from zero to one.

12. A system for locating a fault in a transmission line having a sending end and a receiving end and a tapped load connected to the transmission line at a tap node, the tap node dividing the transmission line into a sending side and a receiving side, the system comprising:

a processor for calculating a fault location in the transmission line;

a sending end measuring device connected to the processor for taking pre-fault and faulted measurements of the sending end of the transmission line;

a receiving end measuring device connected to the processor for taking pre-fault and faulted measurements of the receiving end of the transmission line; and wherein the processor is adapted to obtain measured circuit parameters including measured current and voltage values from the sending end measuring device and the receiving end measuring device, calculate a load impedance of the tapped load, calculate a first fault location assuming that the fault is located on the sending side of the tap node, calculate a second fault location assuming that the fault is located on the receiving side of the tap node; and select the calculated fault location from one of the first fault location and the second fault location, by selecting the fault location having a value within a predetermined range.

13. The system of claim 12 wherein the processor is further adapted to calculate a phase angle due to a time difference in unsynchronized measurements between the sending end measuring device and the receiving end measuring device using the measured pre-fault current and the measured pre-fault voltage values.

14. The system of claim 12 wherein the measured circuit parameters are synchronized between the sending end measuring device and the receiving end measuring device and a phase angle between the sending end measuring device and the receiving end measuring device is zero.

15. The system of claim 12 wherein the transmission line is a single phase transmission line.

16. The system of claim 13 wherein the sending end measuring device comprises a voltage sensor.

17. The system of claim 13 wherein the sending end measuring device comprises a current sensor.

18. The system of claim 13 wherein the receiving end measuring device comprises a voltage sensor.

19. The system of claim 13 wherein the receiving end measuring device comprises a current sensor.

20. The system of claim 13 wherein the sending end measuring device is connected to the processor through a data link.

21. The system of claim 13 wherein the receiving end measuring device is connected to the processor through a data link.

22. The system of claim 13 wherein the sending end measuring device comprises a memory for storing the pre-fault measurements.

23. The system of claim 13 wherein the receiving end measuring device comprises a memory for storing the pre-fault measurements.

24. The system of claim 13 wherein the processor is adapted to obtain the values, $Vp^1_S$, $Ip^1_{S,T1}$, $Vp^1_R$, $Ip^1_{R,T1}$, $V^1_S$, $I^1_{S,T1}$, $V^1_R$, and $I^1_R, I^1_{R,T1}$ where:

$Vp^1_S$ is the positive sequence pre-fault complex voltage from the sending end to ground, $Ip^1_{S,T1}$ is the positive sequence pre-fault complex current from the sending end to the tap node, $Vp^1_R$ is the positive sequence pre-fault complex voltage from the receiving end to ground, $Ip^1_{R,T1}$ is the positive sequence pre-fault complex current from the receiving end to the tap node, $V^1_S$ is the positive sequence faulted complex voltage from the sending end to ground, $I^1_{S,T1}$ is the positive sequence faulted complex current from the sending end to the tap node, $V^1_R$ is the positive sequence faulted complex voltage from the receiving end to ground, and $I^1_{R,T1}$ is the positive sequence faulted complex current from the receiving end to the tap node, and the transmission line is a three phase transmission line.

25. The system of claim 24 wherein the processor is adapted to calculate the phase angle according to the following equation:

$$e^{j\delta} = \frac{Vp^1_S - Z^1_{S,T1} Ip^1_{S,T1}}{Vp^1_R - Z^1_{R,T1} Ip^1_{R,T1}}$$

where:

$Z^1_{S,T1}$ is the positive sequence complex impedance from the sending end to the tap node, $Z^1_{R,T1}$ is the positive sequence complex impedance from the receiving end to the tap node, and δ is the phase angle.

26. The system of claim 25 wherein the processor is adapted to calculate the first fault location according to the following equation:

$$m_{S,T1} = \frac{Z^1_{S,T1}\left(e^{j\delta} I^1_{R,T1} - \frac{e^{j\delta} V^1_R - Z^1_{R,T1} e^{j\delta} I^1_{R,T1}}{Z^1_{T1}}\right)}{Z^1_{S,T1} I^1_{S,T1} + Z^1_{S,T1}\left(e^{j\delta} I^1_{R,T1} - \frac{e^{j\delta} V^1_R - Z^1_{R,T1} e^{j\delta} I^1_{R,T1}}{Z^1_{T1}}\right)}$$

where $m_{R,T1}$ is the calculated first fault location.

27. The system of claim 26 wherein the processor is adapted to calculate the second fault location according to the following equation:

$$m_{R,T1} = \frac{e^{j\delta} V^1_R - V^1_S + Z^1_{S,T1} I^1_{S,T1} + Z^1_{R,T1}\left(I^1_{S,T1} - \frac{V^1_S - Z^1_{S,T1} I^1_{S,T1}}{Z^1_{T1}}\right)}{Z^1_{R,T1} e^{j\delta} I^1_{R,T1} + Z^1_{R,T1}\left(I^1_{S,T1} - \frac{V^1_S - Z^1_{S,T1} I^1_{S,T1}}{Z^1_{T1}}\right)}$$

where $m_{R,T1}$ is the calculated second fault location.

28. The system of claim 27 wherein the processor is adapted select the calculated fault location from of either $m_{S,T1}$ and $m_{R,T1}$ by selecting the one having a value within the predetermined range and the predetermined range represents a full distance between two nodes.

29. The system of claim 28 wherein the predetermined range is from zero to one.

30. A computer-readable medium having instructions stored thereon for locating a fault in a transmission line, the transmission line comprising a sending end and a receiving end, a tapped load connected to the transmission line at a tap node, the tap node dividing the transmission line into a sending side and a receiving side, the sending end comprising a measuring device, the receiving end comprising a measuring device, the instructions, when executed on a processor, causing the processor to perform the following:

obtaining measured circuit parameters including measured current and voltage values at the sending end and at the receiving end of the transmission line;

calculating a load impedance of the tapped load;

calculating a first fault location assuming that the fault is located on the sending side of the tap node;

calculating a second fault location assuming that the fault is located on the receiving side of the tap node; and selecting the calculated fault location from one of either the first fault location and the second fault location, by selecting the fault location having a value within a predetermined range.

31. The computer readable medium of claim 30 further comprising calculating a phase angle due to a time difference in unsynchronized measurements between the sending end measuring device and the receiving end measuring device using the measured pre-fault current and the measured pre-fault voltage values.

32. The computer-readable medium of claim 30 wherein the obtaining measured circuit parameters further comprises obtaining measured circuit parameters from the sending end measuring device and the receiving end measuring device.

33. The computer-readable medium of claim 30 wherein the measured circuit parameters are synchronized between the sending end measuring device and the receiving end measuring device and a phase angle between the sending end measuring device and the receiving end measuring device is zero.

34. The computer-readable medium of claim 30 wherein the transmission line is a single phase transmission line.

35. The computer-readable medium of claim 31 wherein the obtaining measured circuit parameters further comprises obtaining the values, $Yp^1_S$, $Ip^1_{S,T1}$, $VP^1_R$, $Ip^1_{R,T1}$, $V^1_S$, $I^1_{S,T1}$, $V^1_R$, and $I^1_{R,T1}$ where:

$VP^1_S$ is the positive sequence pre-fault complex voltage from the sending end to ground, $Ip^1_{S,T1}$ is the positive sequence pre-fault complex current from the sending end to the tap node, $VP^1_R$ is the positive sequence pre-fault complex voltage from the receiving end to ground, $Ip^1_{R,T1}$ is the positive sequence pre-fault complex current from the receiving end to the tap node, $V^1_S$ is the positive sequence faulted complex voltage from the sending end to ground, $I^1_{S,T1}$ is the positive sequence faulted complex current from the sending end to the tap node, $V^1_R$ is the positive sequence faulted complex voltage from the receiving end to ground, and $I^1_{R,T1}$ is the positive sequence faulted complex current from the receiving end to the tap node, and the transmission line is a three phase transmission line.

36. The computer-readable medium of claim 35 wherein the calculating the phase angle further comprises calculating the phase angle according to the following equation:

$$e^{j\delta} = \frac{Vp^1_S - Z^1_{S,T1} Ip^1_{S,T1}}{Vp^1_R - Z^1_{R,T1} Ip^1_{R,T1}}$$

where:

$Z^1_{S,T1}$ is the positive sequence complex impedance from the sending end to the tap node, $Z^1_{R,T1}$ is the positive sequence complex impedance from the receiving end to the tap node, and $\delta$ is the phase angle.

37. The computer-readable medium of claim 36 wherein the calculating the load impedance of the tapped load comprises calculating the load impedance of the tapped load according to the following equation:

$$Z^1_{T1} = \frac{Vp^1_S - Z^1_{S,T1} Ip^1_{S,T1}}{Ip^1_{S,T1} + e^{j\delta} Ip^1_{R,T1}}$$

where $Z^1_{T1}$ is the positive sequence complex impedance of the tap node.

38. The computer-readable medium of claim 37 wherein the calculating the first fault location comprises calculating the first fault location according to the following equation:

$$m_{S,T1} = \frac{V^1_S - e^{j\delta}V^1_R + Z^1_{R,T1}e^{j\delta}I^1_{R,T1} + Z^1_{S,T1}\left(e^{j\delta}I^1_{R,T1} - \frac{e^{j\delta}V^1_R - Z^1_{R,T1}e^{j\delta}I^1_{R,T1}}{Z^1_{T1}}\right)}{Z^1_{S,T1}I^1_{S,T1} + Z^1_{S,T1}\left(e^{j\delta}I^1_{R,T1} - \frac{e^{j\delta}V^1_R - Z^1_{R,T1}e^{j\delta}I^1_{R,T1}}{Z^1_{T1}}\right)}$$

where $m_{S,T1}$ is the calculated first fault location.

39. The computer-readable medium of claim 38 wherein the calculating the second fault location comprises calculating the second fault location according to the following equation:

$$m_{R,T1} = \frac{e^{j\delta}V^1_R - V^1_S + Z^1_{S,T1}I^1_{S,T1} + Z^1_{R,T1}\left(I^1_{S,T1} - \frac{V^1_S - Z^1_{S,T1}I^1_{S,T1}}{Z^1_{T1}}\right)}{Z^1_{R,T1}e^{j\delta}I^1_{R,T1} + Z^1_{R,T1}\left(I^1_{S,T1} - \frac{V^1_S - Z^1_{S,T1}I^1_{S,T1}}{Z^1_{T1}}\right)}$$

where $m_{R,T1}$ is calculated second fault location.

40. The computer-readable medium of claim 39 wherein the selecting the calculated fault location comprises selecting the calculated fault location from one of either $m_{S,T1}$ and $m_{R,T1}$ by selecting the one having a value within the predetermined range and the predetermined range represents a full distance between two nodes.

41. The computer-readable medium of claim 40 wherein the predetermined range is from zero to one.

\* \* \* \* \*

UNITED STATES PATENT AND TRADEMARK OFFICE
CERTIFICATE OF CORRECTION

PATENT NO. : 6,466,030 B1
DATED : October 15, 2002
INVENTOR(S) : Yi Hu et al.

It is certified that error appears in the above-identified patent and that said Letters Patent is hereby corrected as shown below:

Column 3,
Line 40, "fatiqued" should read -- faulted --

Column 4,
Line 55, "$V_{T1}^{a}$ or , $V_{T1,0}^{a}$" should read -- $V_{T1}^{a}$ or $V_{T1,0}^{a}$ --

Column 5,
Line 2, "$Ip_s^{1,T1}$" should read -- $Ip^1{}_{s,T1}$ --

Line 5, "$VP_{T1}^1$" should read -- $Vp^1{}_{T1}$ --

Signed and Sealed this

Twenty-fifth Day of February, 2003

JAMES E. ROGAN
*Director of the United States Patent and Trademark Office*